United States Patent
Kim et al.

(10) Patent No.: US 6,597,478 B2
(45) Date of Patent: Jul. 22, 2003

(54) PHASE-CONJUGATE HOLOGRAPHIC DATA STORAGE DEVICE USING A MULTIFOCAL LENS AND DATA STORAGE METHOD THEREOF

(75) Inventors: Ji-deog Kim, Seoul (KR); Hong-seok Lee, Kyungki-do (KR); Suk-han Lee, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/006,691

(22) Filed: Dec. 10, 2001

(65) Prior Publication Data

US 2002/0085250 A1 Jul. 4, 2002

(30) Foreign Application Priority Data

Dec. 29, 2000 (KR) .......................................... 2000-86369

(51) Int. Cl.[7] .................................................. G03H 1/26
(52) U.S. Cl. .............................. 359/22; 359/30; 359/31; 369/94
(58) Field of Search ............................... 359/22, 21, 30, 359/31, 29, 35, 16; 369/94, 44.23

(56) References Cited

U.S. PATENT DOCUMENTS 5,986,779 A * 11/1999 Tanaka .......................... 359/19
6,020,985 A * 2/2000 McLeod ......................... 359/22

* cited by examiner

Primary Examiner—John Juba
Assistant Examiner—Leo Boutsikaris
(74) Attorney, Agent, or Firm—Burns, Doane, Swecker & Mathis, L.L.P.

(57) ABSTRACT

A phase-conjugate holographic data storage device capable of enhancing the characteristics of recording and reproducing data by using a focusing lens is provided. The holographic data storage device includes a focusing lens which focuses an object beam having data, a spatial light modulator which is located on the optical path of the object beam passing through the focusing lens and modulates the object beam, and a data recording medium which records an interference pattern generated by interference between a reference beam and the object beam passing through the spatial light modulator and converging into a focus. The focusing lens is a focusing lens having at least two different focuses. The holographic data storage device is capable of effectively reducing a dc term having a bad influence on the characteristics of recording data, minimizing the size of a data unit, that is, a spot, and thus enhancing the density of recording data.

6 Claims, 3 Drawing Sheets

PHASE-CONJUGATE HOLOGRAPHIC DATA STORAGE DEVICE USING A MULTIFOCAL LENS AND DATA STORAGE METHOD THEREOF

Priority is claimed to Patent Application Numbers 2000-86369, filed in the Republic of Korea on Dec. 29, 2000, herein incorporated by reference.

BACKGROUND OF THE INVENTION

1. Field of the Invention

The present invention relates to a phase-conjugate holographic data storage device using a multifocal lens, and more particularly, to a phase-conjugate holographic data storage device capable of enhancing data recording and reproducing characteristics and data recording density by using a multifocal lens.

2. Description of the Related Art

Holography is a technique for reproducing the original form of optical signals, that is, a technique for recording a certain pattern resulting from an interference phenomenon between an object beam reflected by an object and a reference beam traveling straight at a different angle by taking advantage of the characteristics of a laser beam and then reproducing a three dimensional image of the object using the recorded pattern.

In holography, a laser beam having a uniform monowaveform is divided into two beams using a beam splitter such as a semitransparent mirror. One of the two beams is flashed on an object so as to generate an object beam and then, the object beam is caused to interfere with the other beam, thereby creating an interference pattern. After that, the interference pattern is recorded in a storage medium. In reproducing a three dimensional image of the object using the interference pattern, a reference beam is transmitted through the storage medium.

Specifically, a holographic data storage device is used for recording data by transforming optical signals differently modulated depending on types of data into an object beam and reproducing the data. The object beam interferes with a reference beam so as to make an interference pattern. The interference pattern is recorded in a solid formed of material which reacts according to the intensity of the interference pattern (a storage medium) and the interference pattern recorded in the storage medium is called a hologram. If the reference beam is applied to such a hologram, the original form of the object beam used in the recording is reconstructed. Here, the hologram data recorded in the storage medium can be read by using only the reference beam used in recording because a reference beam having a different wavelength or phase is not diffracted by the hologram recorded in the storage medium but just passes through the hologram. Such a holographic technique has been applied to advertising, marketing, industry, exhibitions, packaging or decoration, and new technical applications are being developed.

A typical phase-conjugate holographic data storage device will be described with reference to FIGS. 1A and 1B. FIG. 1A is a diagram illustrating the data recording principle of a typical phase-conjugate holographic data storage device and FIG. 1B is a diagram illustrating the data reproducing principle of a typical phase-conjugate holographic data storage device.

Referring to FIG. 1A, a focusing lens 11 is placed in the path of an object beam 15. A data recording medium 13 is placed at a focal spot into which the object beam 15 converges. A spatial light modulator (SLM) 12 is placed between the focusing lens 11 and the data recording medium 13 on the incidence path of the object beam 15 and is closer to the focusing lens 11. The SLM 12 modulates an optical signal spatially depending on the type of data, and the focusing lens 11 reduces the space band width of the modulated optical signal.

The data storage principle of the phase-conjugate holographic data storage device is as follows. As shown in FIG. 1A, in recording data, the object beam 15 passes through the focusing lens 11 and then is modulated by the SLM 12. The modulated object beam 15 is connected to the storage recording medium 13 and focused by the focusing lens 11 and thus, its space band width is reduced. At this time, a reference beam 16a interferes with the object beam 15 and the interference pattern is recorded in the data recording medium 13. As shown in FIG. 1B, in reading data, a reference beam 16b is applied to the data recording medium 13. As a result, the interference pattern recorded in the data recording medium 13 is reconstructed, output and then sensed by an image sensor 14. In such a mechanism of recording and reproducing data, if a monofocal lens is used in focusing an object beam including data, as is the case in the prior art, light intensity, that is, a direct current (DC) term increases significantly in the middle of the Fourier plane at which the object beam is focused. Thus, the characteristics of recording and reproducing data are deteriorated.

Methods of solving this problem which have been used in the prior art, will be described with reference to FIGS. 2 and 3. Referring to FIG. 2, a data recording medium 23 is arranged a predetermined distance apart from the focal plane of a focusing lens 21. An object beam 24 is spatially modulated by a SLM 22 and is focused by the focusing lens 21. After that, the object beam 24 and a reference beam 25a interfere with each other, thereby creating an interference pattern. The interference pattern is recorded in the data recording medium 23. In this case shown in FIG. 2, the data recording medium 23 is arranged at a distance of several millimeters to several centimeters from the focal spot of the object beam 24 induced by the focusing lens 21. As a result, the focal plane on which the object beam 24 passing through the focusing lens 21 and the SLM 22 is focused is not included in an area in which the interference phenomenon occurs and thus, the size of a signal beam in recording data increases, so that the light intensity in the middle of the Fourier plane, that is, the DC term cannot affect the characteristics of recording and reproducing data.

In the case of reproducing data recorded in the data recording medium 23, the reference beam 25a is applied to the data recording medium 23. As a result, a phase-conjugate signal beam is reproduced and then is detected by an image sensor (not shown).

FIG. 3 is a diagram of a conventional phase-conjugate holographic data storage device in which a phase mask 34 is additionally installed between a SLM 32 and a data recording medium 33. Referring to FIG. 3, the phase mask 34 is placed on an optical path along which an object beam 35 is spatially modulated by the SLM 32 and is focused at a focal plane. As a result, in the case of recording data, the object beam 35 sequentially passing through the focusing lens 31, the SLM 32 and the phase mask 34 interferes with a reference beam 36a, thereby generating an interference pattern. The interference pattern is recorded in the data recording medium 33. If the object beam passes through the phase mask 34, the DC term occurring in the middle of the Fourier plane is weakened. In the case of reproducing data, the phase mask 34 is not necessary.

However, in the case of the holographic data storage device of FIG. 2, focusing of the object beam 24 and the interference phenomenon induced by the object beam 24 and the reference beam 25b occur at different locations. Accordingly, the holographic data storage device has a problem in that the size of a spot to be recorded becomes greater than the size of the spot on the Fourier plane and thus, data recording density becomes smaller than that of the holographic data storage devices of FIGS. 1A and 1B. In the case of the phase-conjugate holographic data storage device shown in FIG. 3, it is required to install the phase mask 34 specially designed between the SLM 32 and the data recording medium 33 and thus, the manufacturing cost of the data storage device increases. In addition, the phase-conjugate holographic data storage device has another problem in that the phase mask 34 should be aligned very precisely.

SUMMARY OF THE INVENTION

To solve the above problems, it is an object of the present invention to provide a phase-conjugate holographic data storage device which is capable of maintaining data storage density by decreasing a direct current term, which is light intensity at the center of the Fourier plane, and is economical and a data storage method thereof.

Accordingly, to achieve the above object, there is provided a holographic data storage device comprising: a multifocal lens which focuses an object beam having data; a spatial light modulator which is located on the optical path of the object beam passing through the multifocal lens and modulates the object beam; and a data recording medium which records an interference pattern generated by interference between a reference beam and the object beam passing through the spatial light modulator and converging into a focus. Here, the multifocal lens is a solution focusing lens having at least two different focuses.

Preferably, the data storage medium is formed of a photorefractive crystal or optical polymer which is capable of storing light in terms of a refractive index.

According to another aspect of the present invention, there is provided a method for recording holographic data in a holographic data storage device comprising a focusing lens focusing an object beam with data and having at least two different focuses, a spatial light modulator located on the optical path of the object beam passing through the focusing lens and modulating the object beam, and a data recording medium recording an interference pattern generated by interference between a reference beam and the object beam passing through the spatial light modulator and converging into a focus, the method comprising: modulating the object beam by using the spatial light modulator; converging the spatially modulated object beam at at least two focuses by using the focusing lens; and recording an interference pattern generated by interference between a reference beam and the object beam passing through the spatial light modulator and converging into a focus in the data recording medium.

Preferably, the data storage medium is formed of a photorefractive crystal or optical polymer which is capable of storing light in terms of a refractive index.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention now will be described more fully with reference to the accompanying drawings, in which preferred embodiments of the invention are shown.

Figure 4:
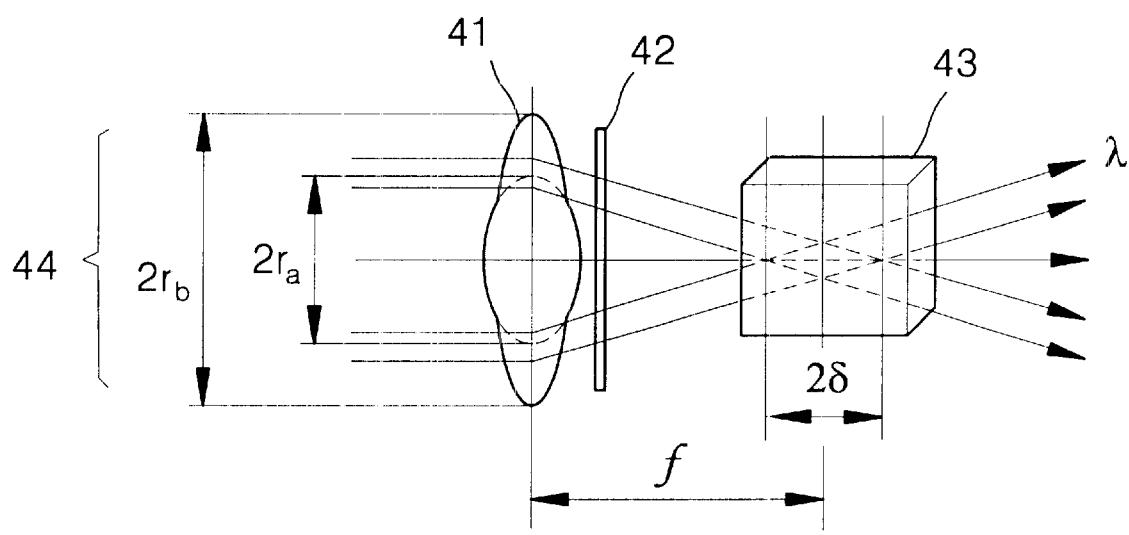
FIG. 4 is a diagram of a phase-conjugate holographic data storage device according to the present invention.

FIG. 4 is a holographic data storage device according to the present invention. Referring to FIG. 4, there is a focusing lens 41 which focuses an object beam 44 received from a light source (not shown) and a data recording medium 43 which records data depending on a position at which the object beam 44 passing through the focusing lens 41 is focused. In addition, there is a SLM 42 which modulates the object beam 44 spatially depending on the data and is located on an optical path of the object beam 44 between the focusing lens 41 and the data recording medium 43.

Unlike a conventional holographic data storage device, the holographic data storage device of the present invention is characterized by a focusing lens having at least two focuses. One or two surfaces of the focusing lens 41 used in the present invention may be spherical. Focal distance varies depending on portions of the focusing lens 41. In this case, the variation of focal distance depending on portions of the focusing lens 41 is a different notion from focal distance variation caused by optical aberration. Actually, the focusing lens 41 used in the present invention is manufactured to have at least two different focal distances. In FIG. 4, a portion of the focusing lens 41 in a range marked as $2r_a$ has a focal distance of f−δ and another portion of the focusing lens 41 outside of the range marked $2r_a$ has a focal distance of f+δ.

The operational mechanism of the holographic data storage device of the present invention will be described with reference to FIG. 4. As shown in FIG. 4, the object beam 44 emitted from a light source (not shown) enters the focusing lens 41 and is focused. The focal distance of the object beam varies depending on portions of the multifocal focusing lens through which the object beam 44 is transmitted. In other words, in a case where the object beam 44 passes through the portion of the focusing lens 41 in the range $2r_a$, the object beam is converged into a focus at a distance of f−δ from the center of the focusing lens 41. However, if the object beam is transmitted through the other portion of the focusing lens 41, the object beam 44 is converged into a focus at a distance of f+δ from the center of the focusing lens 41. Before focusing the object beam 44, the object beam 44 is modulated by the SLM 42 depending on the data of the object beam 44. The modulated object beam 44 and a reference beam (not shown) interfere with each other in the data recording medium 43.

If the interference phenomenon of the object beam injected into the data recording medium 43 and a reference beam occurs, an interference pattern is generated and the interference pattern is recorded in the data recording medium 43. Preferably, the data recording medium 43 is formed of a photorefractive crystal or optical polymer which is capable of storing data in terms of a refractive index.

In the holographic data storage device of the present invention, the focal distance of the object beam 44 varies with portions of the focusing lens through which the object beam 44 is transmitted and accordingly, the place at which interference between the object beam 44 and the reference beam occurs varies. Thus, it is possible to effectively reduce a DC term occurring in the data recording medium 43.

Figure 1A:
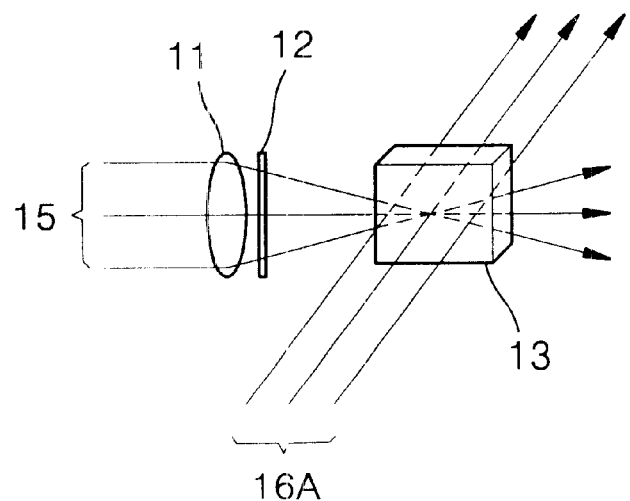
FIG. 1A is a diagram illustrating the data recording principle of a conventional phase-conjugate holographic data storage device.
Figure 1B:
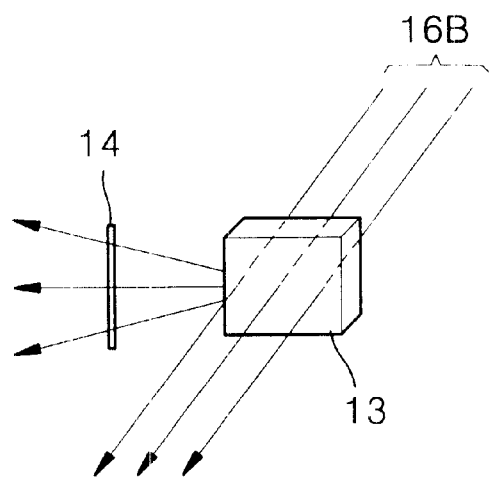
FIG. 1B is a diagram illustrating the data reproducing principle of a conventional phase-conjugate holographic data storage device.
Figure 2:
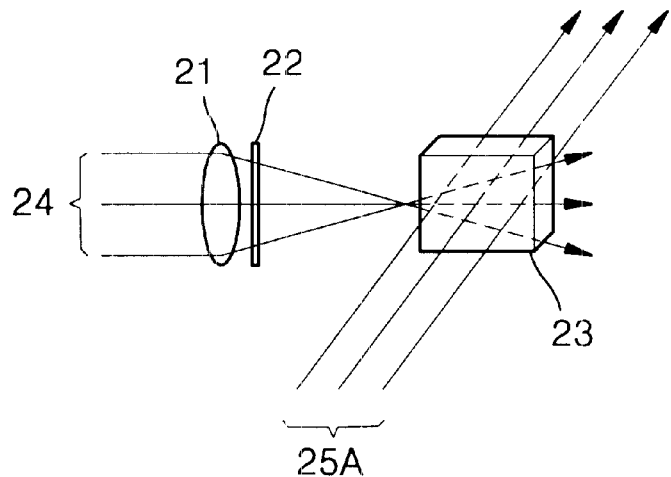
FIG. 2 is a diagram illustrating a method of storing data at a location out of a focal plane in a conventional phase-conjugate holographic data storage device.
Figure 3:
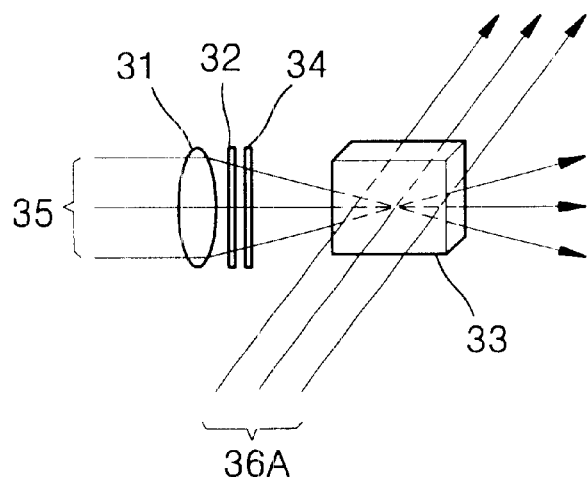
FIG. 3 is a diagram illustrating a conventional phase-conjugate holographic data storage device in which a phase mask is additionally installed between a focusing lens and a data storage medium.

In the prior art shown in FIG. 2, the location at which the object beam 24 is converged into a focus is different from the location at which interference between the object beam 24 and the reference beam 25a occurs. As a result, the size of a spot recorded in the data recording medium 23 becomes greater than a spot to be recorded at the Fourier formation plane and thus, the density of recording data is reduced. However, in the present invention, a spot to be recorded is set to be located at the center of at least two focal planes of the object beam 44, thereby enhancing the density of recording data. In addition, the prior art shown in FIG. 3 has a problem in that the phase mask 34 should be additionally installed in the data storage device. However, in the present invention, a focusing lens which differs little from a monofocal lens in terms of functions and price is used, thereby achieving the same results as the prior art using the phase mask 34.

The data reproducing method of the holographic data storage device of the present invention is as follows. Only a reference beam is applied to the data recording medium 43 in which the interference pattern has been recorded. The interference pattern recorded in the data recording medium 43 diffracts the reference beam, and thus the original signal consisting of bright and dark pixels is restored to a pattern with black and white spots. The restored signal is processed by a photographing device, such as a CCD camera, thereby reproducing data.

In the phase-conjugate holographic data storage device of the present invention, a focusing lens which differs little from a monofocal lens in function and price is used, thereby effectively reducing a DC term having a bad influence on the characteristics of recording data, minimizing the size of a data unit, that is, a spot, and thus enhancing the density of recording data.

What is claimed is:

1. A holographic data storage device comprising:
    a multifocal lens which focuses an object beam having data;
    a spatial light modulator which is located on the optical path of the object beam passing through the multifocal lens and modulates the object beam; and
    a data recording medium which records an interference pattern generated by interference between a reference beam and the object beam passing through the spatial light modulator and converging into a focus,
    wherein the multifocal lens is a focusing lens having at least two different focuses.

2. The holographic data storage device of claim 1, wherein focal distance varies depending on portions of the multifocal lens.

3. The holographic data storage device of claim 1, wherein the data storage medium is formed of a photorefractive crystal or optical polymer which is capable of storing light in terms of a refractive index.

4. A method for recording holographic data in a holographic data storage device comprising a multifocal lens for focusing an object beam with data and having at least two different focuses, a spatial light modulator located on the optical path of the object beam passing through the multifocal lens and modulating the object beam, and a data recording medium recording an interference pattern generated by interference between a reference beam and the object beam passing through the spatial light modulator and converging into a focus, the method comprising:
    modulating the object beam by using the spatial light modulator;
    converging the spatially modulated object beam at at least two focuses using the multifocal lens; and
    recording an interference pattern generated by interference between a reference beam and the object beam passing through the spatial light modulator and converging into a focus in the data recording medium.

5. The method for recording holographic data of claim 4, wherein focal distance varies depending on portions of the multifocal lens.

6. The method for recording holographic data of claim 4, wherein the data storage medium is formed of a photorefractive crystal or optical polymer which is capable of storing light in terms of a refractive index.

* * * * *